United States Patent [19]
Nakatsu

[11] Patent Number: 5,581,116
[45] Date of Patent: Dec. 3, 1996

[54] SEMICONDUCTOR DEVICE MANUFACTURED BY SELECTIVELY CONTROLLING GROWTH OF AN EPITAXIAL LAYER WITHOUT A MASK

[75] Inventor: Hiroshi Nakatsu, Tenri, Japan

[73] Assignee: Sharp Kabushiki Kaisha, Osaka, Japan

[21] Appl. No.: 281,834

[22] Filed: Jul. 28, 1994

[30] Foreign Application Priority Data

Jul. 30, 1993  [JP]  Japan ..................... 5-190497

[51] Int. Cl.⁶ ..................... H01L 29/06; H01L 29/04; H01L 33/00; H01S 3/19
[52] U.S. Cl. ..................... 257/623; 257/96; 257/103; 257/627; 372/46
[58] Field of Search ..................... 257/81, 95–99, 257/103, 618, 623, 627; 372/46

[56] References Cited

U.S. PATENT DOCUMENTS

| | | | |
|---|---|---|---|
| 4,935,936 | 6/1990 | Nelson et al. | 372/46 |
| 4,956,682 | 9/1990 | Ohnaka et al. | 372/50 |
| 5,202,285 | 4/1993 | Sugano et al. | 372/46 |
| 5,291,033 | 3/1994 | Morishima | 257/96 |
| 5,373,173 | 12/1994 | Ohata et al. | 257/627 |

FOREIGN PATENT DOCUMENTS

0319021A2  6/1989  European Pat. Off. .
0533197A2  3/1993  European Pat. Off. .

OTHER PUBLICATIONS

*Patent Abstracts of Japan*, vol. 17, No. 687 (E–1478), Dec. 16, 1993, and JP-A-05 2354-8 (Sharp Corp.), Sep. 10, 1993.
*Patent Abstracts of Japan*, vol 13, No. 51 (E–712), Feb. 6, 1989, and Jp-A-63 244625 (Fujitsu Ltd.), Oct. 12, 1988.
*Patent Abstracts of Japan*, vol 10, No. 201 (E–419), Jul. 15, 1986, and JP-A-61 044485 (Matsushita Electric Ind. Co. Ltd), Mar. 4, 1986
Kukimoto, H., et al., "Selective area control of material properties in laser–assisted MOVPE of GaAs and AlGaAs" *J. Crystal Growth* (1986) (1986) 77;223–228.

Primary Examiner—Mahshid Saadat
Attorney, Agent, or Firm—Morrison & Foerster

[57] ABSTRACT

A semiconductor structure including: a substrate having a step portion; a first semiconductor layer formed on a region of the substrate which is selectively irradiated by light at an angle with respect to the projecting portion by using the step portion as a mask; and a second semiconductor layer formed on a region of the substrate shaded by the step portion.

12 Claims, 9 Drawing Sheets

SEMICONDUCTOR DEVICE MANUFACTURED BY SELECTIVELY CONTROLLING GROWTH OF AN EPITAXIAL LAYER WITHOUT A MASK

BACKGROUND OF THE INVENTION

1. Field of the Invention

The present invention relates to a method for fabricating a semiconductor device by selectively controlling the growth of an epitaxial layer without a mask by irradiating a main surface of a substrate having a difference in level with light during the growth of a semiconductor layer by vapor phase epitaxy. The present invention also relates to a semiconductor device fabricated by the method.

2. Description of the Related Art

A light-emitting diode, a semiconductor laser, an FET (Field Effect Transistor), and a HEMT (High Electron Mobility Transistor), and the like are more and more miniaturized in size and shape so as to meet the demands in recent years for the devices to have higher efficiency and a higher operation rate. Under such conditions, a selective growth technique for growing a semiconductor by vapor phase epitaxy becomes important in order to form devices having a new structure or improve the performance of the devices.

In recent years, there has been an increasing interest in, as one of the selective growth techniques, a technique for controlling a crystal growth of a semiconductor by radiating light having a predetermined exposure pattern from the outside while the semiconductor layer is grown by vapor phase epitaxy so as to three-dimensionally selectively excite an epitaxial layer with light. If the light is radiated on the surface of the substrate during vapor phase epitaxy, the temperature of the surface of the crystal substrate rises, thereby accelerating the photochemical reaction of the semiconductor materials or the surface reaction to incorporate dopants. As a result, the epitaxial layer excited with light is formed.

In such a manner, if a light having a predetermined exposure pattern is radiated during the vapor phase epitaxy, differences between the irradiated portion and the unirradiated portion arise in the growth rate, the composition, and amount of dopant of the epitaxial layer. Therefore, the growth of the epitaxial layer can be selectively controlled without forming a mask on the substrate.

FIG. 11 is a vertical sectional view of an example of a conventional vapor phase epitaxy apparatus utilizing the selective growth technique with the light excitation described above. The vapor phase epitaxy apparatus is composed of an MOCVD (Metal Organic Chemical Vapor Deposition) apparatus provided with a light source for light excitation. The MOCVD apparatus is employed for growing a group III-V compound semiconductor by vapor phase epitaxy utilizing the thermal decomposition of group III organic gas and group V hydride gas.

In the vapor phase epitaxy apparatus, a flow channel 22 is provided within a reactor 21 made of quartz having a cylindrical shape. Gas introducing tubes 24 and 25 for introducing gas into the flow channel 22 are provided through an end wall 23 on one side of the reactor 21. Into the reactor 21, a susceptor 28 made of carbon for mounting a substrate 27, on which a semiconductor layer is grown by vapor phase epitaxy, is introduced from the other side of the reactor 21 in an axis direction. When the susceptor 28 is introduced into the reactor 21 so that the top face thereof on which the substrate 27 is mounted, it is exposed in the flow channel 22. In addition, a high-frequency coil 29 is wound around the outer side wall of the reactor 21.

The upper portion of the side wall of the reactor 21 has an opening 21a. The opening 21a works as a window for introducing light into the reactor 21 from the outside without causing distortion. The opening 21a does not have a path of cooling water for cooling the side wall of the reactor 21. Above the reactor 21, a laser device 30 for excitation is provided. In addition, also provided are: a mirror 31 for introducing laser light emitted from the laser device 30 to the opening 21a; a mask 32 for selective excitation for selectively transmitting the laser light reflected by the mirror 31; and an optical system apparatus 33 for focusing the laser light transmitted through the mask for selective excitation 32 on the substrate 27 in the reactor 21.

The following steps are required for selectively growing a semiconductor layer by using the vapor phase epitaxy apparatus with the light excitation. First, the substrate 27 is mounted on the susceptor 28 and then introduced at a predetermined position in the reactor 21. A current flows through the high-frequency coil 29 so as to heat the susceptor 28 and the substrate 27 to a predetermined temperature. Then, group III organic gas and group V hydride gas are introduced through the gas introducing tube 24 and the gas introducing tube 25, respectively, into the reactor 21 so as to flow through the flow channel 22. In the flow channel 22, the group III organic gas and the group V hydride gas are thermally decomposed, so that a group III-V compound semiconductor is grown on the surface of the substrate 27 by the vapor phase epitaxy. In this case, a carrier gas of hydrogen is introduced through a gas introducing tube 26 to flow outside of the flow channel 22 so as to prevent the residue from adhering to the inner surface of the side wall of the reactor 21.

When the laser light is emitted from the laser device 30 during the vapor phase epitaxy, the laser light is provided with a predetermined pattern at the mask 32 for selective excitation through the mirror 31. Then, the laser light is radiated on the surface of the substrate 27 through the optical system apparatus 33, thereby forming the epitaxial layer selectively excited with light.

In FIG. 12, a light-emitting diode with a current blocking layer fabricated by using the vapor phase epitaxy apparatus device is shown. Japanese Patent Application No. 4-36479 discloses the light-emitting diode.

The light-emitting diode includes a buffer layer 102, a first cladding layer 103, an active layer 104, a second cladding layer 105, a current blocking layer 106, and a current spreading layer 107 successively formed on a substrate 111 made of n-type GaAs. Trimethylindium (TMI)[In(CH$_3$)$_3$], trimethylgallium (TMG)[Ga(CH$_3$)$_3$], and trimethylaluminum (TMA)[Al(CH$_3$)$_3$] as group III organic gases, arsine [ASH$_3$] and phosphine [PH$_3$] as group V hydride gases, and monosilane [SiH$_4$] and dimethylzinc (DMZ)[Zn(CH$_3$)$_2$] as dopants are appropriately supplied to the vapor phase epitaxy device. The buffer layer 102 is formed of n-type GaAs to have a thickness of 0.2 μm. The first cladding layer 103 is formed of n-type (Al$_{0.7}$Ga$_{0.3}$)$_{0.5}$In$_{0.5}$P to have a thickness of 1.5 μm. The active layer 104 is formed of non-doped (Al$_{0.45}$Ga$_{0.55}$)$_{0.5}$In$_{0.5}$P to have a thickness of 0.7 μm. The second cladding layer 105 is formed of p-type (Al$_{0.7}$Ga$_{0.3}$)$_{0.5}$In$_{0.5}$P to have a thickness of 1.5 μm. Each of the layers is uniformly formed by the normal vapor phase epitaxy.

The current blocking layer 106 on the second cladding layer 105 is formed of (Al$_{0.7}$Ga$_{0.3}$)$_{0.5}$In$_{0.5}$P to have a thickness of 0.5 μm. When the current blocking layer 106 is grown by the vapor phase epitaxy, the laser light emitted from the laser device 30 is incident thereon. In this case, the mask 32 for selective excitation has such a pattern that the laser light is radiated only to the central area of the substrate 111. When the laser light is radiated to the epitaxially growing surface of the current blocking layer 106, the decomposition of phosphine [PH$_3$] supplied as group V hydride gas is accelerated, resulting in an increase in the effective V/III ratio of the growing surface or an increase in a percentage of Si atoms of monosilane supplied as a dopant to be incorporated with crystals. Therefore, the resultant current blocking layer 106 includes two regions having different compositions, that is, an n-type current blocking region 106a of the central area on which the laser light is radiated and a p-type current flowing region 106b of the remaining area on which the laser light is not radiated. Namely, a layer having different compositions can be formed by a single vapor phase epitaxy step without a mask.

Then, the current spreading layer 107 is formed on the current blocking layer 106 by the normal vapor phase epitaxy. The current spreading layer 107 is formed of a p-type Al$_{0.7}$Ga$_{0.3}$As to have a thickness of 5 μm. Electrodes 108 and 109 are then formed: the electrode 108 is formed on the entire surface of the substrate 111 which is not in contact with the buffer layer 102; and the electrode 109 is selectively formed on a portion of the current spreading layer 107 only corresponding to the current blocking region 106a.

In the light-emitting diode fabricated in the manner described above, if the voltage is applied to the electrodes 108 and 109, the current flows through the diode avoiding the current blocking region 106a as indicated by the arrows of broken lines G shown in FIG. 12. This is because the current blocking region 106a of the current blocking layer 106 and the second cladding layer 105 form an n-p junction which is reversely biased. Therefore, since the injected current is diffused in a portion of the active layer 104 only corresponding to the current flowing region 106b, the light generated in the active layer 104 can be effectively emitted to the outside without being interrupted by the electrode 109, thereby making it possible to obtain high luminous efficiency.

With the vapor phase epitaxy apparatus described above, however, it is necessary to perform an alignment of the mask 32 for selective excitation and the optical system apparatus 33 with high accuracy since the laser light passing through the mask 32 outside the reactor 21 should be focused by the optical system apparatus 33 on the surface of the substrate 27 in the reactor 21 which is extremely far from the laser device 30. Moreover, a lens used for the optical system apparatus 33 should have a large numerical aperture and a low aberration.

For the reasons described above, the fabrication of a semiconductor device with a conventional vapor phase epitaxy apparatus has a problem in that an expensive optical system apparatus and the like with high accuracy are required, resulting in an increase in fabrication cost.

SUMMARY OF THE INVENTION

A semiconductor structure according to the present invention includes: a substrate having a step portion; a first semiconductor layer formed on a region of the substrate which is selectively irradiated by light at an angle with respect to the projecting portion by using the step portion as a mask; and a second semiconductor layer formed on a region of the substrate shaded by the step portion.

In one embodiment of the invention, the first semiconductor layer has a different conductivity type from that of the second semiconductor layer.

In another embodiment of the invention, the first semiconductor layer has a different composition from that of the second semiconductor layer.

In still another embodiment of the invention, the first semiconductor layer is continuous with the second semiconductor layer.

Alternatively, a semiconductor light emitting device according to the present invention includes: a substrate having a projecting portion on a main surface; a semiconductor multilayer including at least an active layer which functions as a light emitting layer formed on the projecting portion; and a burying semiconductor layer covering side faces of the semiconductor multilayer, the burying semiconductor layer including a first region of a first conductivity type and a second region of a second conductivity type formed on a region of the substrate shaded by the projecting portion when light is radiated at an angle with respect to the main face of the substrate.

In one embodiment of the invention, the substrate is a semi-insulating semiconductor substrate.

In another embodiment of the invention, the projecting portion is one of a mesa-shape and a reverse mesa-shape.

In still another embodiment of the invention, the side faces of the projecting portion are (111) planes.

Alternatively, a semiconductor light emitting device according to the present invention includes: a substrate having a projecting portion on a main surface; a semiconductor multilayer formed on the projecting portion including at least an active layer which functions as a light emitting layer, and having a ridge; and semiconductor layers of first and second conductivity types for covering side faces of the semiconductor multilayer which are provided in two spaces divided by the ridge, respectively.

In one embodiment of the invention, the substrate is a semi-insulating semiconductor substrate.

In another embodiment of the invention, the projecting portion is one of a mesa-shape and a reverse mesa-shape.

In still another embodiment of the invention, the side faces of the projecting portion are (111) planes.

A method for fabricating a semiconductor structure according to the present invention including the steps of: forming a projecting portion on a main surface of a substrate; and substantially simultaneously depositing a first semiconductor layer on a region of the substrate which is irradiated by light and a second semiconductor layer on a region of the substrate which is shaded by the projecting portion, using the projecting portion as a mask by radiating the light at an angle with respect to the projecting portion.

In one embodiment of the invention, the first and the second semiconductor layers are deposited by vapor phase epitaxy.

In another embodiment of the invention, the deposition step is for depositing the first semiconducto layer having a first conductivity type and the second semiconductor layer having a second conductivity type by optically exciting a gas material.

In still another embodiment of the invention, the deposition step is for depositing the first semiconductor layer having a first conductivity type and the semiconductor layer having a second conductivity type by optically exciting a crystal surface.

Alternatively, a method for fabricating a semiconductor light emitting device according to the present invention includes the steps of: forming a projecting portion on a main surface of a substrate; forming a semiconductor multilayer on the projecting portion including an active layer which functions at least as a light emitting layer; irradiating the semiconductor multilayer by light at an angle with respect to the projecting portion using the projecting portion as a mask, so as to provide an irradiated region and an unirradiated region in the semiconductor multilayer, thereby forming a first semiconductor layer of a first conductivity type substantially simultaneously with a second semiconductor layer of a second conductivity type on the irradiated region and the unirradiated region.

In one embodiment of the present invention, the first and the second semiconductor layers are formed by vapor phase epitaxy.

In another embodiment of the present invention, the projecting portion is formed so as to expose a (111) plane.

In still another embodiment of the present invention, the semiconductor multilayer is formed on the projecting portion so as to have a ridge.

In the semiconductor device of the present invention, it is possible to inject a current with high efficiency into a layered structure having a doublehetero structure formed on a projecting portion. It is also possible to efficiently obtain the light emitted in the doublehetero structure from the region between a pair of electrodes. For example, assuming that the layered structure has an active layer and a second cladding layer successively formed on a first cladding layer, a first conductor region and the second cladding layer have a p-type conductivity, and a second conductor region and the first cladding layer have an n-type conductivity, the functions of the present invention will be herein described. When a potential higher than that applied to the electrode connected to the second conductor region is applied to the electrode connected to the first conductor region, the current flows in the order of the first conductor region, the second cladding layer, the active layer, the first cladding layer, and the second conductor region. Since the current is not diffused in the other region, it is possible to efficiently inject the current into the active layer. For example, if the side surface of the layered structure is a (111)B plane, the total reflection of the emitted light is reduced as compared with the case where the light is emitted from the plane. This is because the light generated in the active layer is emitted from the surface of the projecting portion. Therefore, the emitted light from the active layer can be efficiently obtained.

In a fabricating method of the semiconductor device of the present invention, the layered structure formed on the projecting portion and the region shaded by the projecting portion are prevented from being irradiated by the light and the remaining portion alone is exposed to the light by radiating the light at an angle with respect to the surface of the substrate having the projecting portion. Therefore, if a burying semiconductor layer having a first conductivity is grown in the state described above, the irradiated region has a second conductivity due to the light excitation and the unirradiated region remains as a first conductivity region.

For the above reasons, according to the fabricating method of the present invention, it is possible to fabricate the semiconductor device with high luminous efficiency by the selective growth technique with the light excitation without a mask, and an adjustment device for precise mask alignment, and an optical system apparatus with high accuracy are not required.

According to another fabricating method of a semiconductor device of the present invention, when the light is radiated at an angle with respect to the surface of the substrate having a projecting portion, the light is prevented from being radiated on a region shaded by the projecting region and is radiated on the remaining region alone. Therefore, if the semiconductor layers are grown on the substrate by the vapor phase epitaxy in the state described above, the growth rate, the composition, and the amount of dopants in the irradiated region are different from those in the unirradiated region. Thus, it is possible to selectively control the growth of the epitaxial layers utilizing the differences.

As a result, according to the fabricating method described above, since the projecting portion of the surface of the substrate acts as a mask for the selective growth, it is possible to selectively control the growth of the epitaxial layers without using a mask during the fabrication process of the semiconductor device by the selective growth technique with the light excitation.

According to the fabricating method of the semiconductor device of the present invention, it is possible to fabricate the semiconductor device by the selective growth technique with the light excitation without using an adjustment device for precise mask alignment nor an optical system apparatus with high accuracy, thereby lowering the fabrication cost of the semiconductor device. In addition, according to the light-emitting diode of the present invention, it is possible to obtain the light emitted from the emitting surface with high efficiency by providing a light generating portion on the projecting portion as well as efficiently inject the current into the active layer alone on the projecting portion which is not blocked by the electrodes. Moreover, since the semiconductor structure of the present invention adopts a semi-insulating substrate, it is possible to make the semiconductor structure monolithic with devices having other functions such as an FET for injected current modulation, an HBT (Heterojunction Bipolar Transistor), a PD (Photo Diode) as a photodetector, and a PT (Photo Transistor).

Thus, the invention described herein makes possible the advantages of (1) providing a method for fabricating a semiconductor device which dispenses with an adjustment device for precise mask alignment and an optical system apparatus with high accuracy by irradiating a substrate having a difference in level with light at an angle with respect to the substrate and (2) providing a light-emitting diode fabricated by the method.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples, with reference to the accompanying drawings.

EXAMPLE 1

Figure 1:
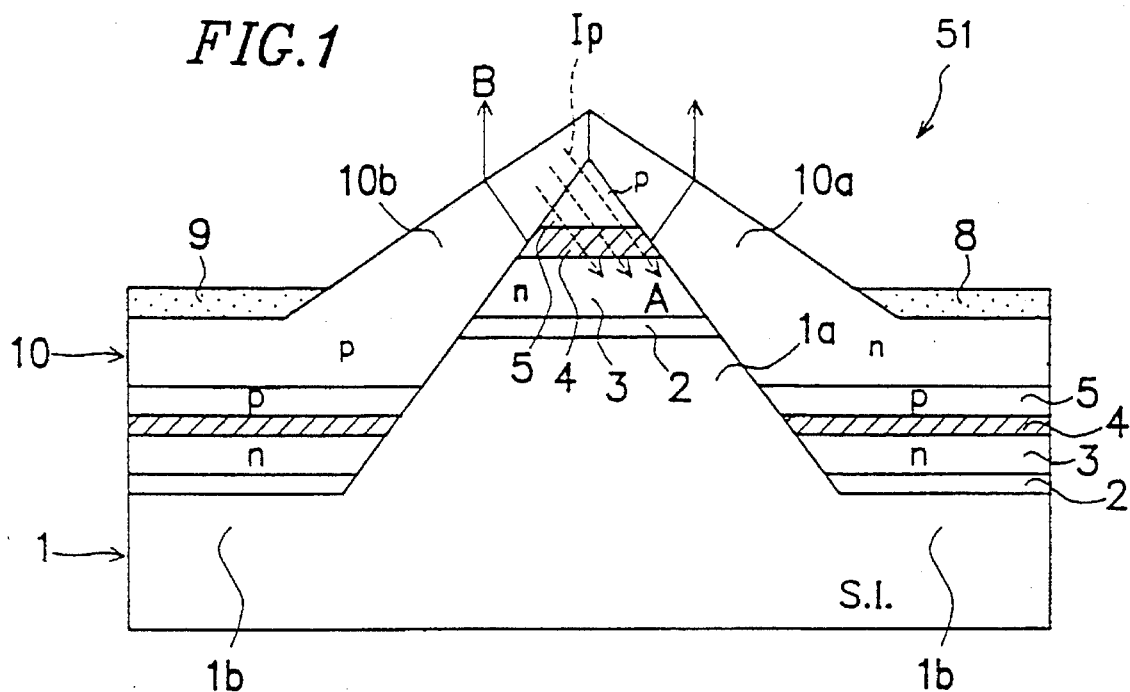
FIG. 1 is a cross-sectional view showing a light-emitting/diode in Example 1 according to the present invention.
Figure 4A:
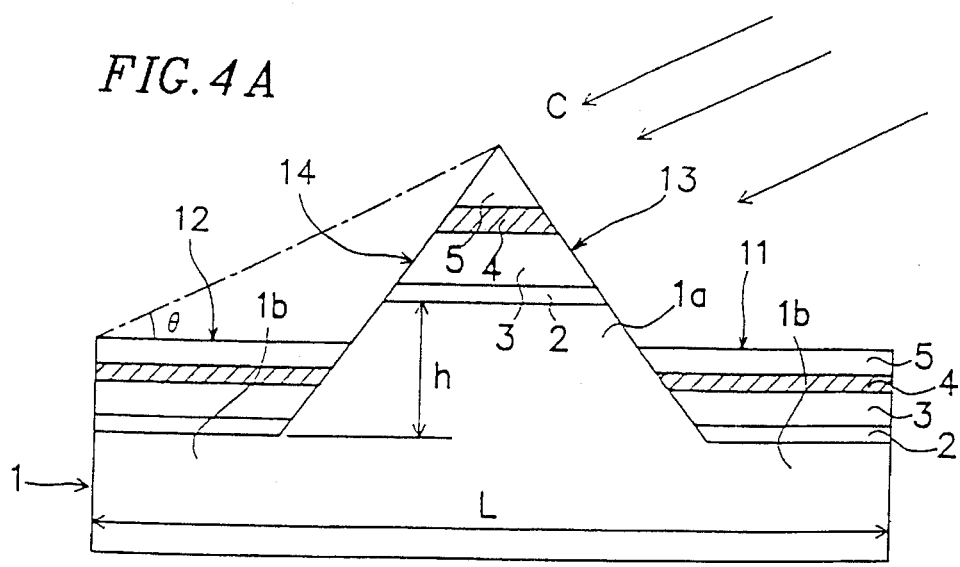
FIGS. 4A to 4C are vertical cross-sectional views illustrating a growth of a burying semiconductor layer.
Figure 4B:
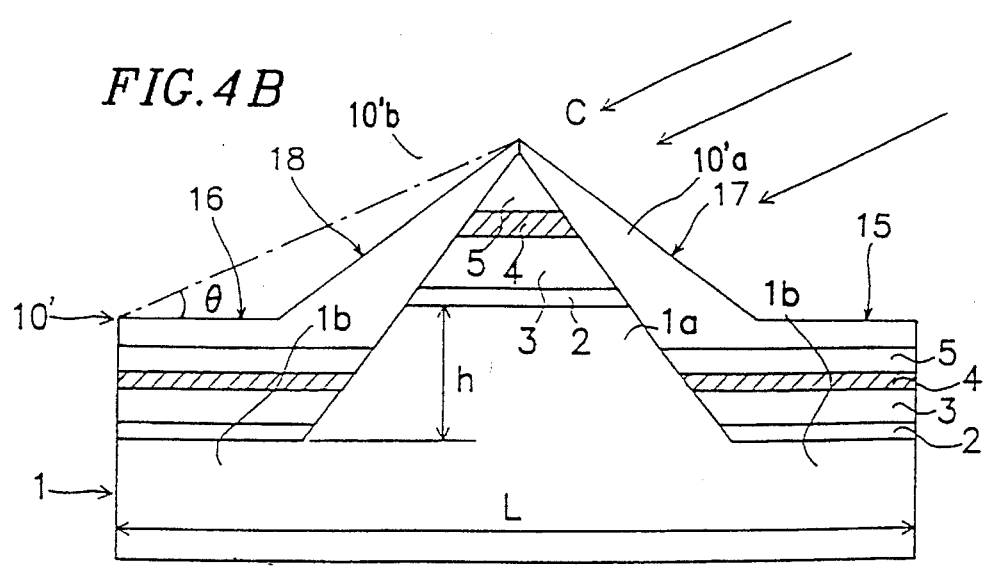
Figure 4C:
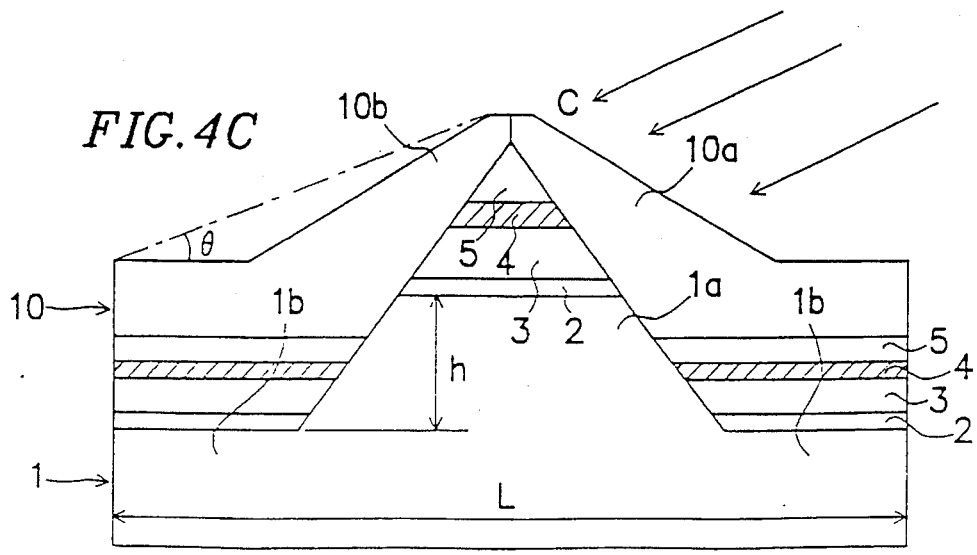
Figure 5:
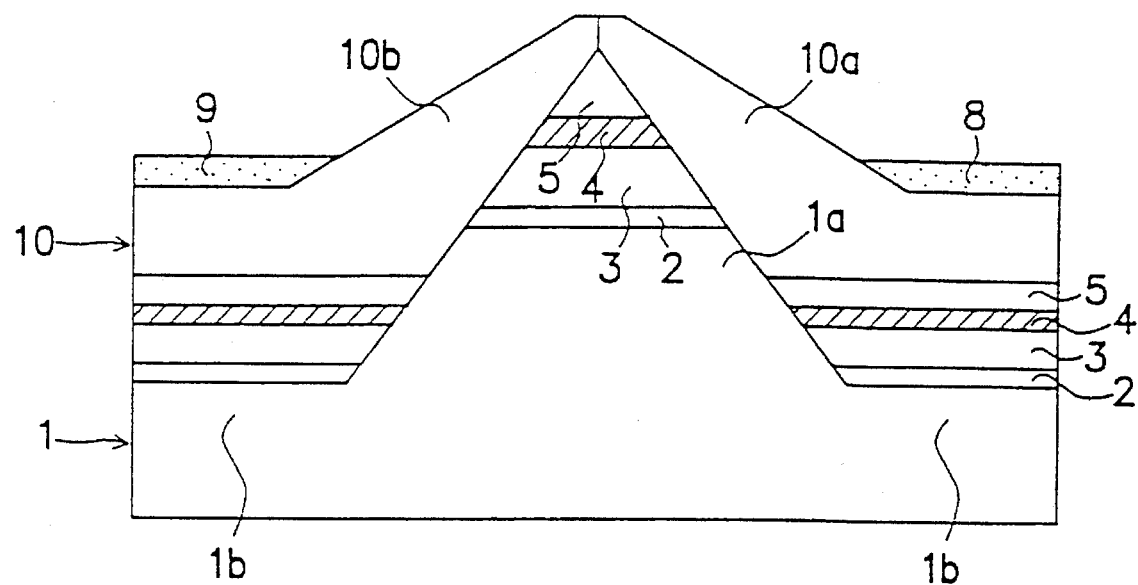
FIG. 5 is a vertical cross-sectional view showing a final fabrication step of a light-emitting diode.
Figure 6:
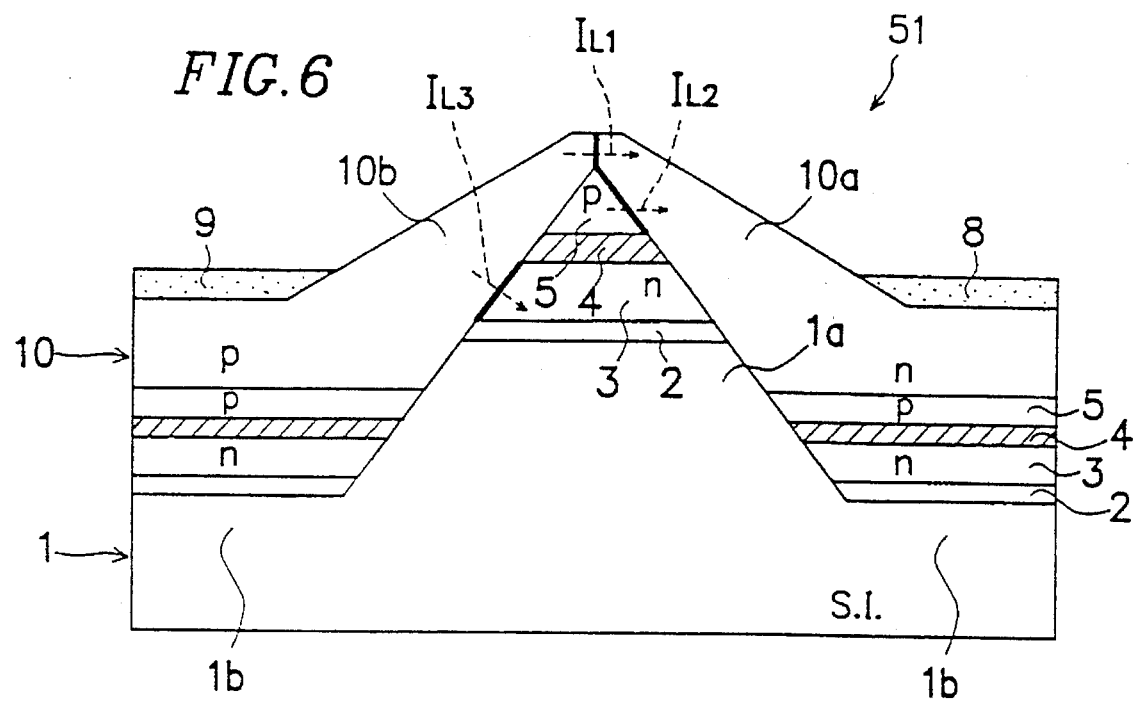
FIG. 6 is a cross-sectional view illustrating a current injected into a light-emitting diode.

FIGS. 1 to 6 show Example 1 of the present invention. FIG. 1 is a cross-sectional view showing the configuration of a light-emitting diode, and FIGS. 2 to 5 are vertical sectional views showing fabrication steps of the light-emitting diode. FIG. 6 illustrates a current flowing in the light-emitting diode.

In Example 1, a light-emitting diode using a group III-V compound semiconductor is described.

As shown in FIG. 1, a light-emitting diode 51 has a projecting portion 1a having a mesa-shape in a central area of a surface of a substrate 1. Although it is preferable that the substrate 1 is a semi-insulating substrate, the material for the substrate 1 is not limited thereto. An n-type buffer layer 2 is formed on a flat face of the projecting portion 1a of the substrate 1 and on flat surfaces of lower side areas 1b on both sides of the projecting portion 1a. Furthermore, an n-type first cladding layer 3 is formed on the n-type buffer layer 2. An undoped active layer 4 is formed on the n-type first cladding layer 3. A p-type second cladding layer 5 is formed on the undoped active layer 4. The n-type buffer layer 2, the n-type first cladding layer 3, the undoped active layer 4, and the p-type second cladding layer 5 constitute a doublehetero layer.

The layers 2 to 5 on the projecting portion 1a are formed into a triangular shape along the side slopes of the projecting portion 1a so that the upper layer has a smaller area than that of the lower layer. The layers 2 to 5 disposed on the lower side areas 1b are formed so that the upper layer has a larger area than that of the lower layer along the side slopes of the projecting portion 1a. The uppermost layer, i.e., the second cladding layer 5 formed above the lower side areas 1b is lower than the flat surface of the projecting portion 1a, so that the side slope of the projecting portion 1a between the second cladding layer 5 on the lower side areas 1b and the n-type buffer layer 2 on the projecting portion 1a is exposed.

A burying semiconductor layer 10 is formed on the layer 5 above the lower side areas 1b so as to cover the side faces of the layers 2 to 5 above the projecting portion 1a and to cover the entire surface of the substrate 1. The burying semiconductor layer 10 is divided into two parts by the ridge of the layers 2 to 5 on the projecting portion 1a: the right part shown in FIG. 1 is an n-type burying semiconductor layer 10a; and the left part is a p-type burying semiconductor layer 10b. The burying semiconductor layer 10 can be formed by a single growth step using the selective growth technique with the light excitation. Electrodes 8 and 9 are formed on the n-type burying semiconductor layer 10a and the p-type burying semiconductor layer 10b above the lower side areas 1b, respectively.

A fabricating method of the light-emitting diode having the configuration described above is described with reference to FIGS. 2 to 5.

Figure 2:
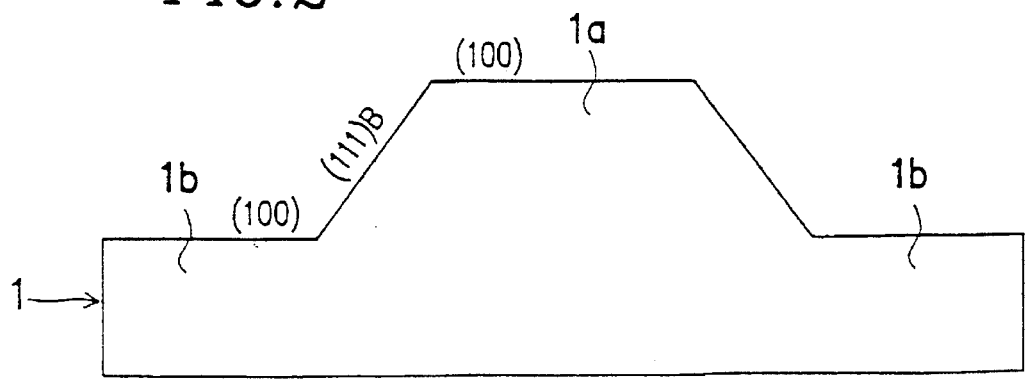
FIG. 2 is a vertical cross-sectional view showing a first fabrication step of a light-emitting diode.
Figure 12:
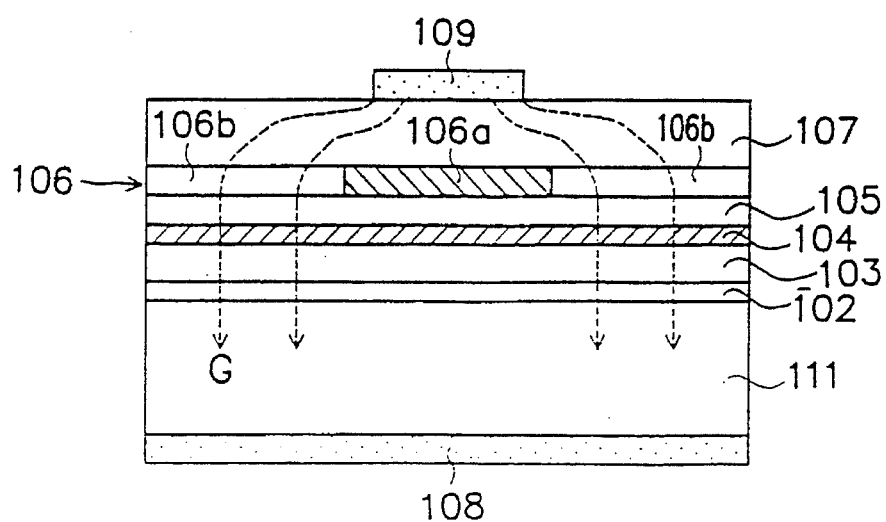
FIG. 12 is a cross-sectional view showing an example of a light-emitting diode fabricated by using the apparatus shown in FIG. 11.

The substrate 1 used in Example 1 is made of semi-insulating GaAs, while the substrate 11 shown in FIG. 12 is an n-type GaAs substrate. In the central area of the surface of the substrate 1, as shown in FIG. 2, the projecting portion 1a having a difference in level of 5 μm and a width of about 20 μm is formed by wet etching or dry etching. The central area of the surface of the substrate 1 is masked and then the (100) plane of the unmasked region is etched in a [011] direction, thereby forming the projecting portion 1a. In this case, the side slopes of the projecting portion 1a become (111)B planes while the flat surface of the projecting portion 1a and the lower side areas 1b remain as the (100) plane. Even if the (100) plane of the substrate 1 is inclined at a few degrees in a direction, it does not substantially affect the fabrication of the semiconductor layers.

Figure 3:
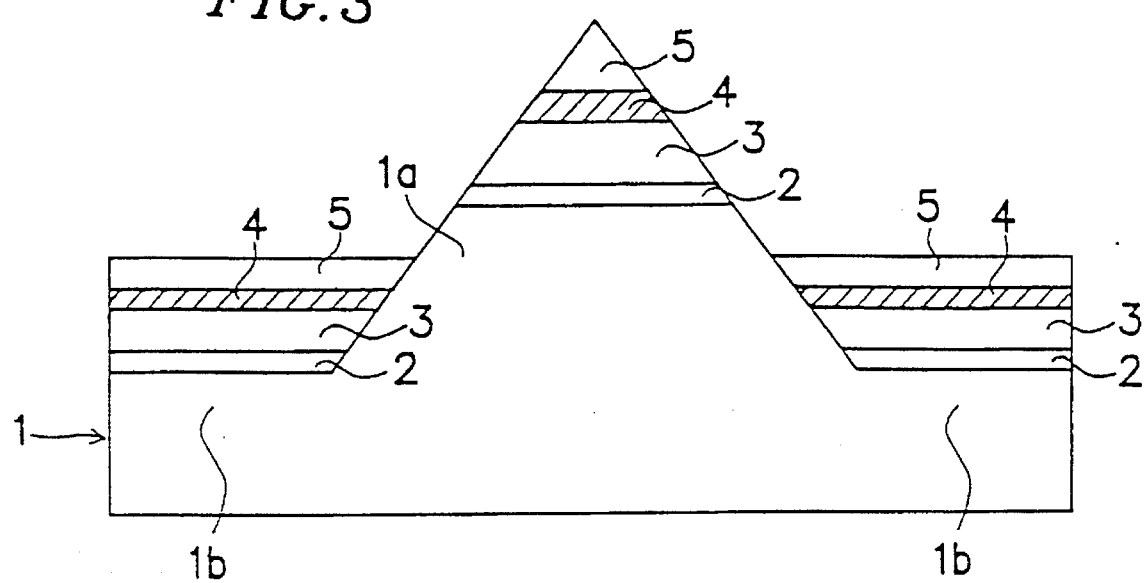
FIG. 3 is a vertical cross-sectional view showing a second fabrication step of a light-emitting diode.

As shown in FIG. 3, a semiconductor layer is formed on the surface of the substrate 1 having the projecting portion 1a by the MOCVD method. First, a buffer layer 2 made of n-type GaAs and a first cladding layer 3 made of n-type AlGaInP are formed on the substrate 1 and the buffer layer 2, respectively. Then, an active layer 4 made of undoped AlGaInP and a second cladding layer 5 made of p-type AlGaInP are formed on the first cladding layer 3 and the active layer 4, respectively. Trimethylindium (TMI) $[In(CH_3)_3]$, trimethylgallium (TMG)$[Ga(CH_3)_3]$, and trimethylaluminum (TMA)$[Al(CH_3)_3]$ as group III organic gases, arsine $[AsH_3]$ and phosphine $[PH_3]$ as group V hydride gases, monosilane $[SiH_4]$ and dimethylzinc (DMZ) $[Zn(CH_3)_2]$ as dopants are appropriately supplied to the vapor phase epitaxy device. The buffer layer 2 is formed of n-type GaAs to have a thickness of 0.2 μm. The first cladding layer 3 is formed of n-type $(Al_{0.7}Ga_{0.3})_{0.5}In_{0.5}P$ to have a thickness of 1.5 μm. The active layer 4 is formed of undoped $(Al_{0.45}Ga_{0.55})_{0.5}In_{0.5}P$ to have a thickness of 0.7 μm. The second cladding layer 5 is formed of p-type $(Al_{0.7}Ga_{0.3})_{0.5}In_{0.5}P$ to have a thickness of 1.5 μm. Each of the layers is uniformly formed by normal vapor phase epitaxy. The growth conditions are set to be a growth temperature of 700° C. and a V/III ratio of 100. Since each of the layers 2 to 5 on the projecting portion 1a is grown while forming the (111)B planes under the growth conditions described above, the layers 2 to 5 are formed into a triangular shape in which the upper layer has a smaller area than that of the lower layer along the side slopes of the projecting portion 1a, as shown in FIG. 3. Therefore, the width of the projecting portion 1a should be set so that the ridge of the triangle can be formed when the uppermost layer, i.e., the second cladding layer 5, is formed to have a predetermined thickness. Each of the layers 2 to 5 is formed on the lower side area 1b along the side slope of the projecting portion 1a so that the upper layer is wider than the lower layer. However, since the side slopes of the projecting portion 1a are (111) planes, the layers 2 to 5 are not grown on the side slopes. Since the difference in level of the projecting portion 1a is about 5 μm, the second cladding layer 5, which is the uppermost layer formed on the lower side area 1b, is lower than the flat portion of the projecting portion 1a, thereby exposing the side slopes of the projecting portion 1a by 1 μm or more.

After the layers 2 to 5 are formed over the substrate 1 as described above, the burying semiconductor layer 10 is formed by MOCVD with the light excitation as shown in FIGS. 4A through 4C. The burying semiconductor layer 10 is formed of AlGaInP having the same composition ratio as that of the current blocking layer 106 shown in FIG. 12. Moreover, the projecting portion 1a and the lower side areas 1b are connected by the growth of a (311) plane. Thus, the burying semiconductor layer 10 is formed so as to cover the entire surface of the substrate 1. The burying semiconductor layer 10 is formed so as to have thicknesses of, for example, 3 μm on the flat area and 1.5 μm in the vicinity of the ridge.

During the vapor phase epitaxy of the burying semiconductor layer 10, the laser light (excitation light) is radiated at an angle (not at a right angle) with respect to the surface of the substrate 1 as indicated by the arrows C with solid lines shown in FIG. 4A. The intensity of the laser light and the peak output can be set in the range, for example, from 100 to 400 joules (J) per pulse and from 10 to 40 megawatts (MW), respectively. Moreover, the laser light having a wavelength of 248.5 nanometers (nm) or 249.5 nm is herein applied. The laser light having such wavelength and intensity can be obtained, for example, by a KrF excimer laser apparatus. The irradiation conditions of the laser light for excitation can also be applied to the fabrication of a light-emitting diode of the other examples described later. However, the irradiation conditions of the laser light for excitation are not limited to the examples of the values described above.

Assuming that the difference in level between the projecting portion 1a and the lower side area 1b, that is, the height from the top face of the layers 2 to 5 on the lower side areas 1b to the ridge of the layers 2 to 5 on the projecting portion 1a is h and the length of the device region which is also referred to as a chip size is L, the incident angle θ of the laser light is obtained by following Equation (1):

$$\theta = \arctan[h/(L/2)] \quad (1)$$

Figure 11:
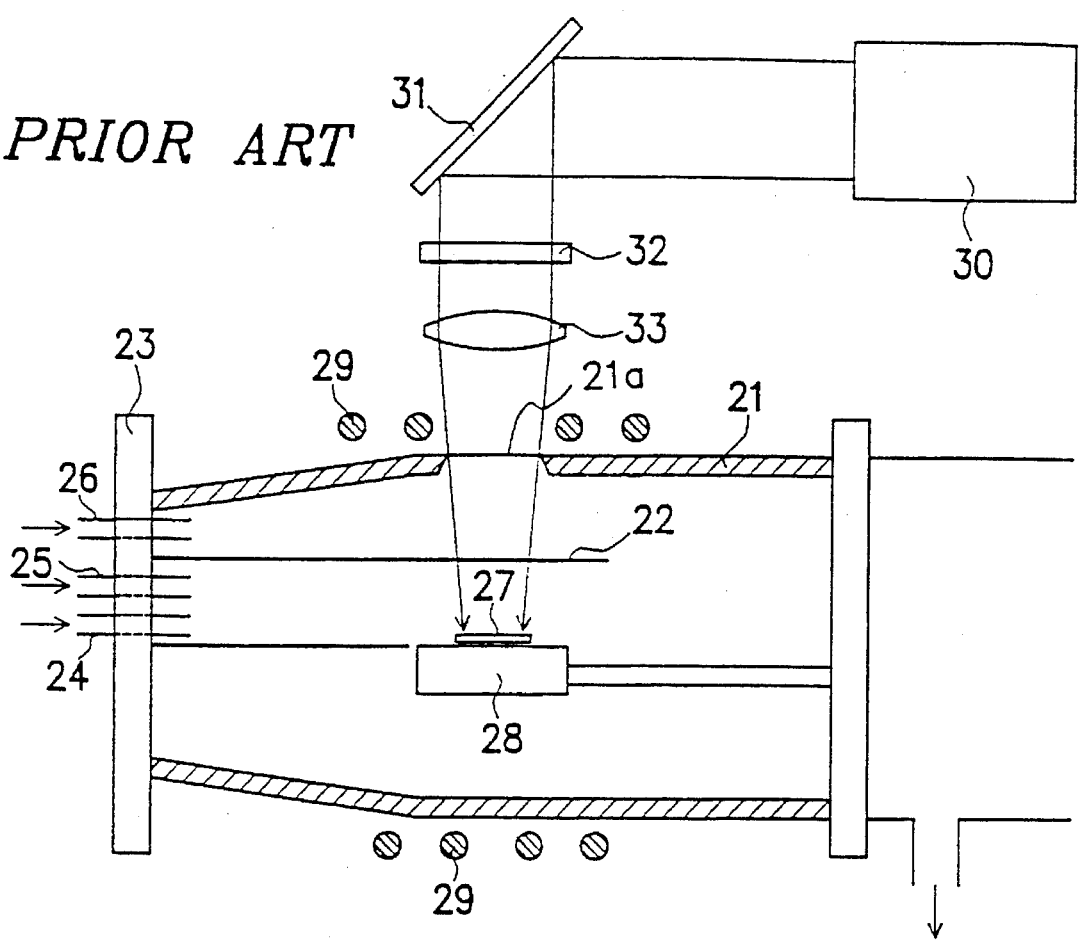
FIG. 11 is a schematic sectional view of a conventional vapor/phase epitaxy apparatus.

Therefore, assuming h=10 μm and L=300 μm, the incident angle θ is obtained to be 3.8°. In order to radiate the laser light at the obtained incident angle θ by using the vapor phase epitaxy apparatus shown in FIG. 11, it is sufficient to modify the angle of the mirror 31 or incline the susceptor 28 by rotating in the axis direction. In the case where the vapor phase epitaxy apparatus shown in FIG. 11 is used, however, the mask 32 for selective excitation and the optical system apparatus 33 for focusing the pattern of the mask 32 are not required. The same group III organic gases, the group V hydride gases, and the dopants as those used in the conventional example are used and supplied to the vapor phase epitaxy apparatus.

If the laser light is radiated at the incident angle θ during the vapor phase epitaxy of the burying semiconductor layer 10, the left part from the ridge of the layers 2 to 5 on the projecting portion 1a is not exposed to the laser light. More specifically, since the surface 11 of the cladding layer 5 is on the right side, the surface 11 is exposed to the laser light. On the other hand, since the surface 12 of the cladding layer 5 is on the left side, the laser light is prevented from being radiated thereon, whereby the surface 12 is shaded. Moreover, since the slope 13 of the layers 2 to 5 on the projecting portion 1a is on the right side, the laser light is radiated thereon. On the other hand, as being on the left side, the slope 14 is not exposed to the light.

As shown in FIG. 4B, the burying semiconductor layers 10'a and 10'b are grown so as to bury the ridge of the layer 5 on the projecting portion 1a during the growth of the burying semiconductor layers 10'a and 10'b. Therefore, the burying semiconductor layer 10'a formed on the right side is exposed to the laser light and the burying semiconductor layer 10'b formed on the left side is shaded by the layers 2 to 5 on the projecting portion 1a, thereby preventing the laser light from being radiated thereon. More specifically, the surface of the lower side area 15 of the burying semiconductor layer 10'a and the slope 17 are exposed to the laser light, while the surface of the lower side area 16 of the burying semiconductor layer 10'b and the slope 18 are shaded.

FIG. 4C shows the terminal point of the growth of the burying semiconductor layer 10. As shown in the figure, when the burying semiconductor layer 10 on the ridge has a thickness of about 1.5 μm, the ridge area is flattened. The burying semiconductor layer 10b is completed under the condition that the laser light is not radiated thereon.

Therefore, since the surfaces 11 and 15 on which the burying semiconductor layer 10a is grown and the slopes 13 and 17 are always exposed to the light as shown in FIGS. 4A to 4C, the decomposition of phosphine [PH$_3$] supplied as group V hydride gas is accelerated. This results in an increase in the effective V/III ratio of the growing surface, or an increase in a ratio of Si atoms of monosilane incorporated with the crystals. As a result, the burying semiconductor layer 10a made of $(Al_{0.7}Ga_{0.3})_{0.5}In_{0.5}P$ having an n-type conductivity with the impurity concentration of $5\times10^{17}/cm^3$ is formed.

Since the surfaces 12 and 16 on which the burying semiconductor layer 10'b is formed and the slopes 14 and 18 are always prevented from being exposed to the light, the burying semiconductor layer 10b made of $(Al_{0.7}Ga_{0.3})_{0.5}In_{0.5}P$ having a p-type conductivity with the impurity concentration of $3\times10^{17}/cm^3$ is formed. In short, the two layers having different compositions can be formed by a single vapor phase epitaxy step without a mask.

After the formation of the burying semiconductor layer 10 is completed, as shown in FIG. 5, the electrodes 8 and 9 are formed on the n-type burying semiconductor layer 10a corresponding to the right lower side area 1b shown in FIG. 5 and on the p-type burying semiconductor layer 10b corresponding to the left lower side area 1b, respectively, thereby completing the light-emitting diode. It is sufficient to form the electrodes 8 and 9 in the region except the upper area on the projecting portion 1a which functions as a light emitting region. However, auxiliary electrodes can be formed even in the upper area of the projecting portion 1a as long as it does not take a large area.

In the light-emitting diode 51, when the voltage is applied to the electrodes 8 and 9, the current does not flow through the layers 2 to 5 on the lower side area 1a as shown in FIG. 1 since the substrate 1 is a semi-insulating substrate. As a result, the injected current Ip is injected into the active layer 4 on the projecting portion 1a alone. Since the light generated in the active layer 4 is emitted through an emitting surface of the projecting portion as indicated by the arrows B of the solid lines, the total reflection is reduced as compared with the case where the emitting surface is flat, thereby improving the external light emitting efficiency by one or more orders. More specifically, in the case where the light-emitting diode of Example 1 is molded using a resin to have a diameter of 5 mm, the light intensity of 3 candela can be obtained while the current of 20 mA is passed.

As shown in FIG. 6, PN junctions indicated by thick lines are formed between the burying semiconductor layers 10b and 10a, the burying layer 10a and the second cladding layer 5 above the projecting portion 1a, and the burying layer 10b and the first cladding layer 3 above the projecting portion 1a, respectively. These three PN junctions, however, do not function so as to prevent the current from flowing into the active layer 4 formed on the projecting portion 1a.

The composition ratio of each semiconductor layer forming the three PN junctions is determined so that each semiconductor layer has a larger band gap than that of the active layer 4. Therefore, the built-in voltage at each PN junction is larger than that at PN junctions between the active layer 4 and the cladding layer 3, and the active layer 4 and the cladding layer 5. Thus, leak currents $I_{L1}$, $I_{L2}$, and $I_{L3}$ are so small as compared with the operating current Ip that they can be put to practical use without any difficulty.

Although the semi-insulating GaAs substrate is used as the substrate 1 in Example 1, a substrate which is transparent with respect to an emitted light wavelength such as a GaP substrate and an InGaP substrate can also be used as long as it is a semi-insulating substrate. Therefore, an Si substrate, a Ga substrate, a glass substrate, or the like can also be used. The composition of the active layer 4 is not limited to AlGaInP. InGaAsP/InP or GaAs/AlGaAs can also be used as a composition of the active layer 4. An emitted light wavelength can optionally be selected from the waveband between a red band and a green band by changing the composition of the active layer 4. Furthermore, it is desirable that MOCVD is adopted as vapor phase epitaxy in the present invention. However, other methods such as MBE (Molecular Beam Epitaxy), ALE (Atomic Layer Epitaxy), or CBE (Chemical Beam Epitaxy) can also be used. Moreover, the present invention is not limited to the light-emitting diode, but a surface light emitting type semiconductor laser can also be made. Although the first cladding layer 3 is n-type and the second cladding layer 5 is p-type in Example 1, each of the two layers can be made of the opposite type of semiconductor.

EXAMPLE 2

Figure 7:
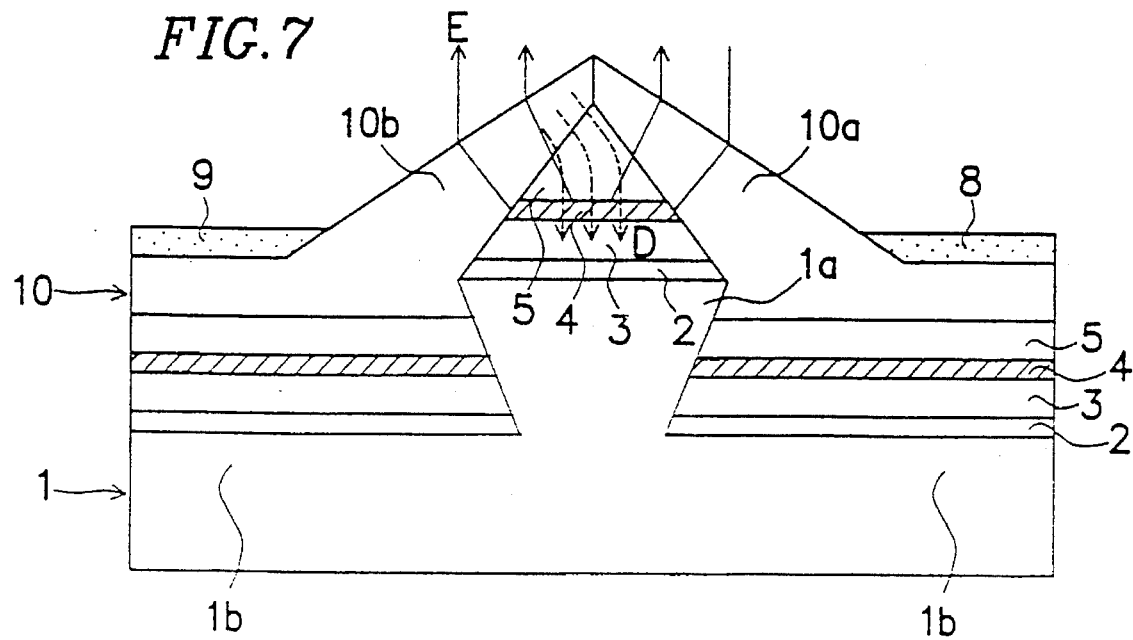
FIG. 7 is a cross-sectional view of a light-emitting diode in Example 2 according to the present invention.

FIG. 7 is a vertical cross-sectional view showing a configuration for a light-emitting diode so as to illustrate Example 2 of the present invention. In FIG. 7, components having the same functions as those of Example 1 shown in FIG. 1 are indicated by the same reference numerals, and the descriptions thereof are omitted.

In Example 2, the projecting portion 1a on the substrate 1 shown in Example 1 is formed into a reverse mesa-shape. More specifically, the projecting portion having a reverse mesa-shape is formed by etching in a [0–11] direction with respect to the (100) plane of both sides with a mask on the central area of the surface of the substrate 1. The layers 2 to 5 and the burying semiconductor layer 10 and the like can be formed in the same manner as that of Example 1. When the current is applied to the electrodes 8 and 9, the current is injected with high current efficiency as indicated by the arrows of broken lines D shown in FIG. 7 and the light generated in the active layer 4 is emitted from the emitting surface of the projecting portion 1a as indicated by the arrows E with solid lines. As a result, the emitted light can be obtained with high efficiency, thereby obtaining the same effects as those in Example 1.

EXAMPLE 3

Figure 8:
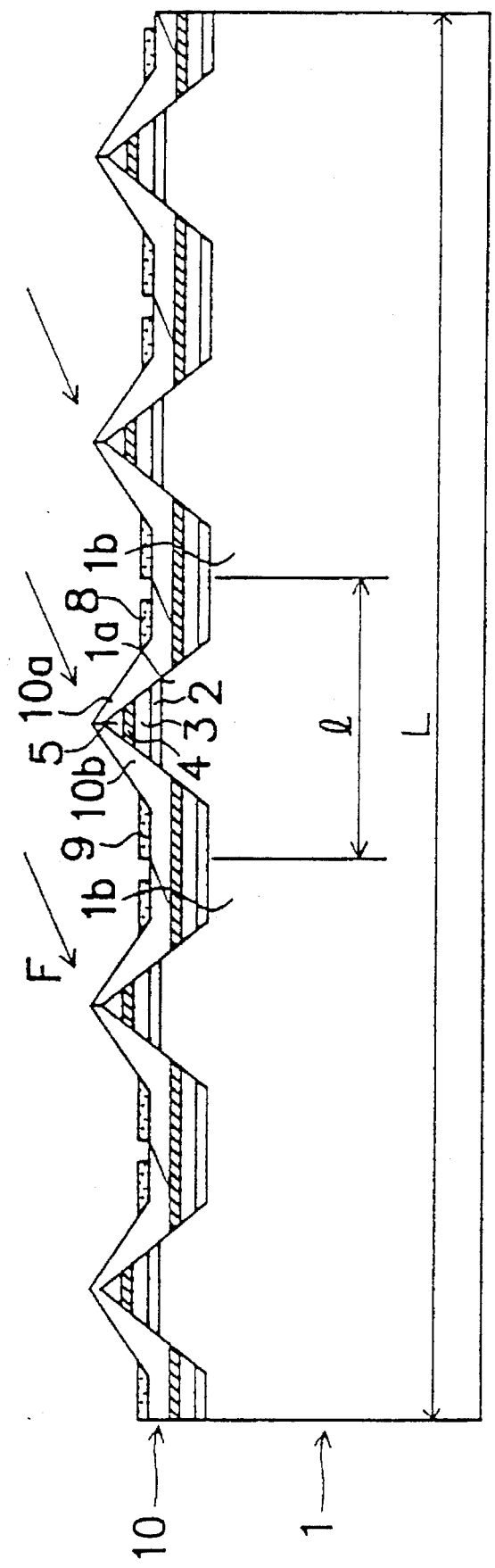
FIG. 8 is a cross-sectional view of a light-emitting diode in Example 3 according to the present invention.
Figure 9:
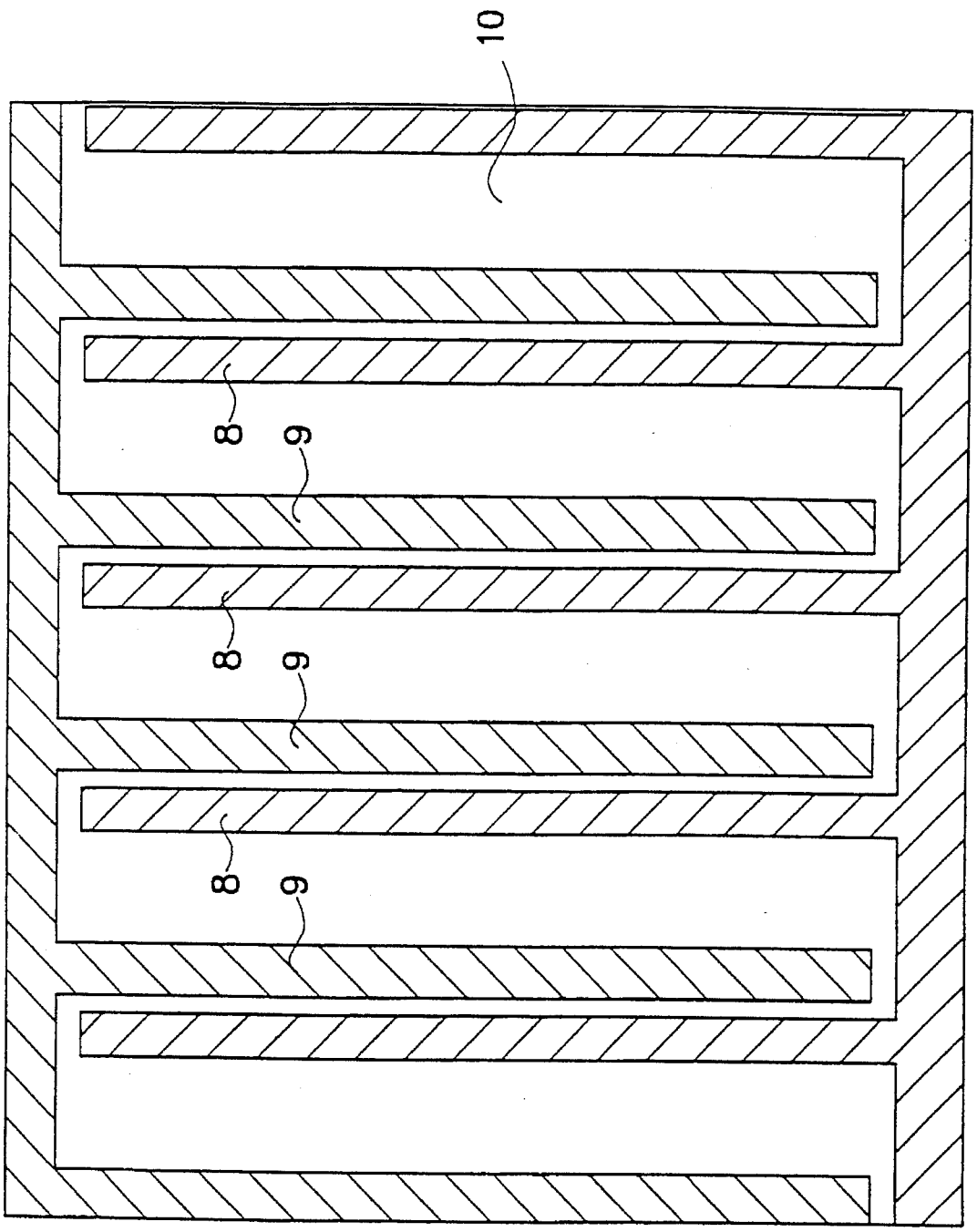
FIG. 9 is a plan view showing the wiring pattern of electrodes of a light-emitting diode in Example 3 according to the present invention.

FIGS. 8 and 9 show Example 3 of the present invention. FIG. 8 is a vertical cross-sectional view showing a configuration for a light-emitting diode, and FIG. 9 is a plan view showing a wiring pattern of the electrodes of the light-emitting diode. In FIGS. 8 and 9, components having the same functions as those of Example 1 shown in FIG. 1 are indicated by the same reference numerals, and the descriptions thereof are omitted.

In Example 3, a plurality of projecting portions 1a are formed on a single device region on the substrate 1. The buffer layer 2, the first cladding layer 3, the active layer 4, the second cladding layer 5, the n-type burying semiconductor layer 10a and the p-type burying semiconductor layer 10b of the burying semiconductor layer 10, and the electrodes 8 and 9 are formed on each of the projecting portion 1a and the lower side areas 1b as in Example 1.

Assuming that the length L of the device region is constant, if a single projecting portion 1a is formed in the device region, the incident angle θ of the laser light for the formation of the semiconductor substrate 10 is proportional to the difference in level h between the projecting portion 1a and the lower side area 1b as indicated by Equation (1) described above. However, since it is impossible to set the difference in level h of the projecting portion 1a to be wide, the incident angle θ results in a small value, for example, 3.8° obtained in Example 1. In Example 3, however, the length L of the device region is divided by providing a plurality of the projecting portions 1a. Therefore, it is possible to radiate the laser light indicated by the arrows with solid lines F shown in FIG. 8 at a large angle θ. Namely, if n projecting portions are provided at regular intervals in the device region, the length l of each light emitting region is obtained to be L/n. The incident angle θ of this case is obtained by the following Equation (2):

$$\theta = \arctan [h/(l/2)] \qquad (2)$$

For example, if ten projecting portions 1a are formed under the same conditions of h=10 μm and L=300 μm as those in Example 1, an incident angle θ of 18°, which is a sufficiently large value, can be obtained.

In Example 3, however, since the current should be injected into the active layer 4 on each projecting portion 1a, it is necessary to provide the electrodes 8 and 9 for each projecting portion 1a. Therefore, the electrodes 8 and 9 are formed in a combination to have a comb-like shape on the burying semiconductor layer 10 as shown in FIG. 9 so that the current is injected into the plurality of light emitting regions with high efficiency.

The light intensity of 4 candela is obtained at a wavelength of 555 nm by the light-emitting diode of the present invention.

Although the semiconductor substrates having a projecting portion are used in the preceding examples, it will be appreciated that semiconductor substrates having other three-dimensional shapes which can shade a predetermined portion by the irradiation of light may alternatively be used. Other three-dimensional shapes such as a cylindrical shape, a trigonal pyramid, and a cone projecting on the surface of the substrate can also be used. Alternatively, a concave portion may be formed on the surface of the substrate, so that light is radiated at an angle with respect to the surface of the semiconductor substrate so as to prevent the light from being radiated on the bottom face of the concave portion, thereby growing the semiconductor layers.

Figure 10:
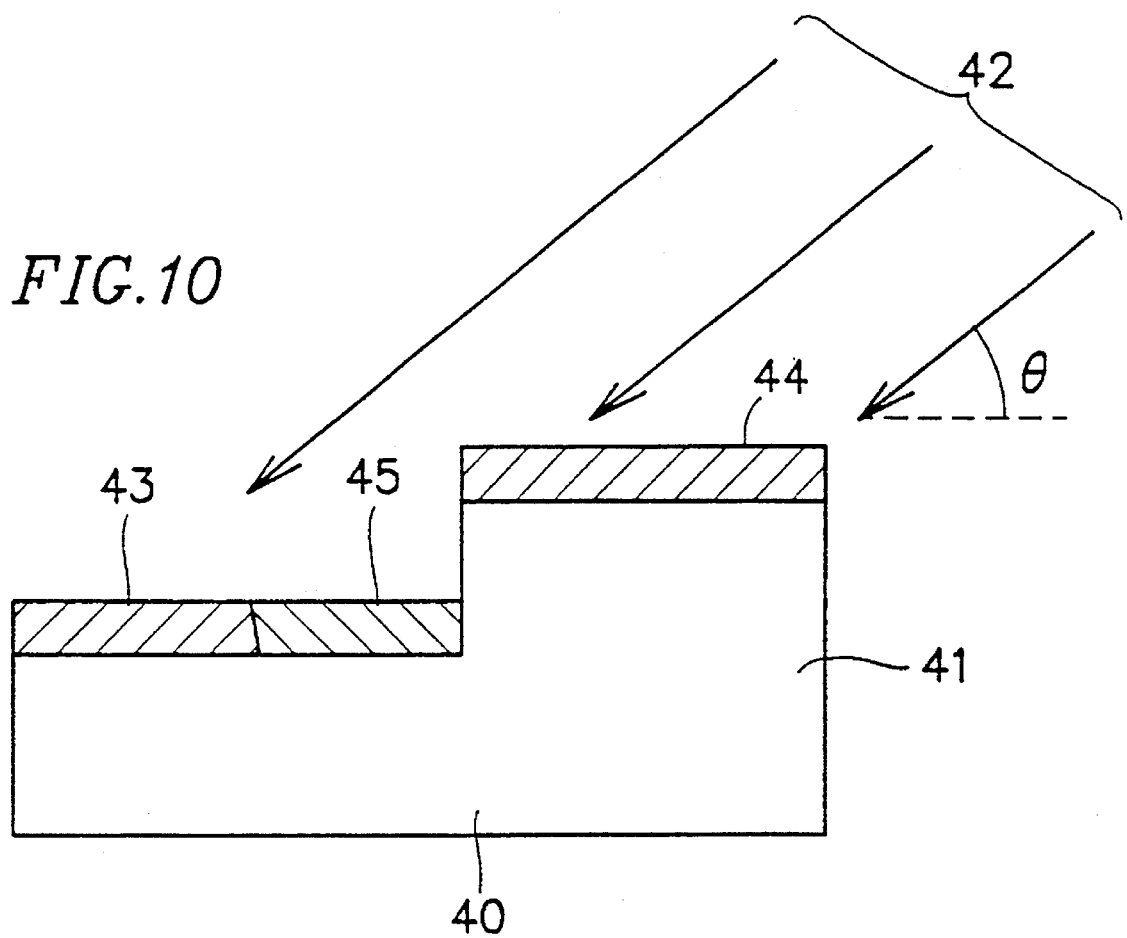
FIG. 10 is a cross-sectional view illustrating a concept of the present invention.

FIG. 10 is a sectional view for illustrating a method for forming a conductive layer on a substrate 40 having a step 41 thereon. Semiconductor layers 43, 44, and 45 can be formed by the vapor phase epitaxy, radiating light 42 at an angle θ with respect to the surface of the substrate 40. For example, if the semiconductor layer is deposited under the conditions for forming the burying semiconductor layers of the light-emitting diode described above, the semiconductor layers 43 and 44 formed of $(Al_{0.7}Ga_{0.3})_{0.5}In_{0.5}P$ having an n-type conductivity with an impurity concentrations of $5\times10^{17}/cm^3$ and the semiconductor layer 45 formed of $(Al_{0.7}Ga_{0.3})_{0.5}In_{0.5}P$ having a p-type conductivity with an impurity concentrations of $3\times10^{17}/cm^3$ are formed.

Although the n-type semiconductor layers and the p-type semiconductor layers are formed by the selective irradiation of the light in the preceding examples, semiconductor layers having different compositions can be formed by taking advantage of the difference in reactivity.

For example, AlGaAs layers having different Al composition ratios can be selectively formed by using trimethylgalium (TMG)[$Ga(CH_3)_3$], trimethylaluminum (TMA) [$Al(CH_3)_3$], and arsine [$ASH_3$] as gas materials and monosilane [$SiH_4$] as a dopant. If the gas materials described above are used for forming the semiconductor layers by radiating the light 42 on the semiconductor substrate 40 as shown in FIG. 10, the semiconductor layers 43 and 44 made of $Al_xGa_{1-x}As$ (x=0.55) and the semiconductor layer 45 made of $Al_yGa_{1-y}As$ (y=0.45) can be formed.

As described above, the present invention has an advantage that semiconductor layers having different conductivities and compositions can be formed by a single vapor phase epitaxy step. It is also apparent from the foregoing descriptions that the present invention can be applied to the fabrication of semiconductor lasers or semiconductor transistors as well as that of the light-emitting diodes.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor light emitting device comprising:

a substrate having a projecting portion on a main surface;

a semiconductor multilayer including at least an active layer which functions as a light emitting layer formed on the projecting portion; and a burying semiconductor layer covering side faces of the semiconductor multilayer, the burying semiconductor layer including a first region of a first conductivity type and a second region of a second conductivity type, wherein the first region is formed on a region of the substrate which is irradiated with a light at an angle with respect to the projecting portion and wherein the second region being formed on a region of the substrate which is masked from the light by the projecting portion.

2. A device according to claim 1, wherein the substrate is a semi-insulating semiconductor substrate.

3. A device according to claim 1, wherein the projecting portion is a mesa-shape.

4. A device according to claim 3, wherein the side faces of the projecting portion are (111) planes.

5. A device according to claim 3, wherein the side faces of the projecting portion are perpendicular to a [0–11] direction.

6. A semiconductor light emitting device comprising:

a substrate having a projecting portion on a main surface;

a semiconductor multilayer formed on the projecting portion and including at least an active layer which functions as a light emitting layer, the semiconductor multilayer having a pair of side faces disposed on either side of a horizontally extending ridge;

a first semiconductor layer of a first conductivity type, covering one of the side faces of the semiconductor multilayer; and a second semiconductor layer of a second semiconductivity type, covering the other of the side faces of the semiconductor multilayer.

7. A device according to claim 6, wherein the substrate is a semi-insulating semiconductor substrate.

8. A device according to claim 6, wherein the projecting portion is a mesa-shape.

9. A device according to claim 8, wherein the side faces of the projecting portion are perpendicular to a [0–11] direction.

10. A device according to claim 8, wherein the side faces of the projecting portion are (111) planes.

11. A semiconductor structure comprising:

a substrate having a main surface and a step portion provided on the main surface;

a single semiconductor layer including at least a first region and a second region, the first region being formed on a first portion of the main surface which is selectively irradiated with light at an angle with respect to the step portion, and the second region being formed on a second portion of the main surface which is masked by the step portion, thereby preventing the light from irradiating the second region, and wherein the first region and second region have different compositions.

12. A semiconductor structure comprising:

a substrate having a main surface and a step portion provided on the main surface;

a single semiconductor layer including at least a first region and a second region, the first region being formed on a first portion of the main surface which is selectively irradiated with light at an angle with respect to the step portion, and the second region being formed on a second portion of the main surface which is masked by the step portion, thereby preventing the light from irradiating the second region, and wherein the first region and second region have different conductivity types.

* * * * *

UNITED STATES PATENT AND TRADEMARK OFFICE

CERTIFICATE OF CORRECTION

PATENT NO. : 5,581,116

DATED : December 3, 1996

INVENTOR(S) : Hiroshi Nakatsu

It is certified that error appears in the above-identified patent and that said Letters Patent is hereby corrected as shown below:

In column 6, line 55, after "light-emitting" please delete "/".

In column 7, line 11, please change "vapor/phase" to --vapor phase--.

In column 12, line 29, please change "length l" to --length $\ell$--.

In column 12, line 34, please change "[h/(l/2)]" to --[h/($\ell$/2)]--.

In column 13, line 18, please change "[ASH$_3$]" to --[AsH$_3$]--.

Signed and Sealed this

Fourteenth Day of July, 1998

Attest:

BRUCE LEHMAN

*Attesting Officer*    *Commissioner of Patents and Trademarks*